(12) United States Patent
Huang et al.

(10) Patent No.: US 12,295,172 B2
(45) Date of Patent: May 6, 2025

(54) DISPLAY PANEL INCLUDING DRIVING BACKPLANE

(71) Applicant: Wuhan China Star Optoelectronics Semiconductor Display Technology Co., Ltd., Hubei (CN)

(72) Inventors: Can Huang, Wuhan (CN); Wenxu Xianyu, Wuhan (CN); Chunpeng Zhang, Wuhan (CN); Tiyao Ma, Wuhan (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 0 days.

(21) Appl. No.: 17/765,831

(22) PCT Filed: Nov. 11, 2021

(86) PCT No.: PCT/CN2021/130095
§ 371 (c)(1),
(2) Date: Mar. 31, 2022

(87) PCT Pub. No.: WO2023/077542
PCT Pub. Date: May 11, 2023

(65) Prior Publication Data
US 2024/0047471 A1 Feb. 8, 2024

(30) Foreign Application Priority Data
Nov. 2, 2021 (CN) .......................... 202111288514.8

(51) Int. Cl.
*H10D 86/60* (2025.01)
*H01L 23/00* (2006.01)
(Continued)

(52) U.S. Cl.
CPC ............. *H10D 86/60* (2025.01); *H01L 24/05* (2013.01); *H01L 24/08* (2013.01); *H10D 86/441* (2025.01);
(Continued)

(58) Field of Classification Search
CPC ... H01L 27/124; H01L 27/1218; H01L 27/15; H01L 24/05; H01L 24/08;
(Continued)

(56) References Cited

U.S. PATENT DOCUMENTS

2014/0375916 A1* 12/2014 Chen ................... H01L 27/1218
349/33
2016/0195790 A1 7/2016 Park
(Continued)

FOREIGN PATENT DOCUMENTS

CN 109904080 A 6/2019
CN 109950289 A 6/2019
(Continued)

OTHER PUBLICATIONS

International Search Report in International application No. PCT/CN2021/130095, mailed on May 25, 2022.
(Continued)

*Primary Examiner* — Ida M Soward
(74) *Attorney, Agent, or Firm* — PV IP PC; Wei Te Chung

(57) ABSTRACT

A display panel and a display device are provided. The display panel includes a driving backplane and a plurality of display components arranged in an array and on the driving backplane, and each of the display components includes a plurality of first bonding terminals and a plurality of signal lines, and each of the display components is electrically connected to the driving backplane through the plurality of first bonding terminals, and each of the signal lines is
(Continued)

electrically connected to the corresponding first bonding terminal, respectively, to alleviate the technical problem that relatively larger splicing gaps exist at the splicing sites of the current super-large display screen.

20 Claims, 3 Drawing Sheets

(51) Int. Cl.
*H10D 86/40* (2025.01)
*H10K 59/131* (2023.01)
*H10K 59/90* (2023.01)
*G09G 3/3266* (2016.01)
*G09G 3/3275* (2016.01)
*H10K 59/18* (2023.01)

(52) U.S. Cl.
CPC ......... *H10K 59/131* (2023.02); *H10K 59/90* (2023.02); *G09G 3/3266* (2013.01); *G09G 3/3275* (2013.01); *G09G 2300/0408* (2013.01); *H01L 2224/0557* (2013.01); *H01L 2224/05624* (2013.01); *H01L 2224/08225* (2013.01); *H10K 59/18* (2023.02)

(58) Field of Classification Search
CPC ... H01L 2224/0557; H01L 2224/08225; H01L 2224/05624; H10K 59/131; H10K 59/90; H10K 59/18; G09F 9/20; G09F 9/30; G09G 3/3266; G09G 3/3275; G09G 3/20; G09G 2300/0408; H10D 86/60; H10D 86/441; H10D 86/411; H10H 29/10
See application file for complete search history.

(56) References Cited

U.S. PATENT DOCUMENTS

| 2020/0312886 A1* | 10/2020 | Yuan | ............... H10K 77/111 |
| 2020/0359499 A1* | 11/2020 | Hwu | ............... H10K 59/131 |
| 2021/0305283 A1* | 9/2021 | Di | ............... H01L 27/1218 |

FOREIGN PATENT DOCUMENTS

| CN | 110034150 A | | 7/2019 | | |
| CN | 110277365 A | | 9/2019 | | |
| CN | 110518054 A | * | 11/2019 | ......... | H01L 27/3244 |
| CN | 111463228 A | | 7/2020 | | |
| CN | 111681610 A | | 9/2020 | | |
| CN | 113342209 A | | 9/2021 | | |
| CN | 113571541 A | * | 10/2021 | ............ | H01L 27/15 |
| CN | 113745303 A | | 12/2021 | | |
| WO | 2020220519 A1 | | 11/2020 | | |
| WO | WO-2020237629 A1 | * | 12/2020 | ............ | H01L 24/13 |

OTHER PUBLICATIONS

Written Opinion of the International Search Authority in International application No. PCT/CN2021/130095, mailed on May 25, 2022.
Chinese Office Action issued in corresponding Chinese Patent Application No. 202111288514.8 dated Jan. 24, 2025, pp. 1-7.

* cited by examiner

DISPLAY PANEL INCLUDING DRIVING BACKPLANE

FIELD OF INVENTION

The present application relates to display technologies, and more particularly to a display panel and a display device.

BACKGROUND OF INVENTION

With the continuous development of display technology, the application of super-large display screen is more and more extensive, as the super-large display screen meets people's requirements for viewing from long-distance away and for displaying large amount of information. Considering the cost, the current super-large display screen is generally realized by splicing technology, that is, multiple sub-display screens are spliced together with one another to form a super-large display screen. However, when multiple display screens are spliced together, relatively larger black splicing gaps will appear at the splicing sites, which seriously affects the display quality of the super-large display screen.

Therefore, it is a problem needing to be solved that relatively larger splicing gaps exist at the splicing sites in the current super-large display screens.

SUMMARY OF INVENTION

The present application provides a display panel and a display device, to alleviate the technical problem that relatively larger splicing gaps exist at the splicing sites in the current super-large display screen.

To solve the aforesaid problem, the technical solution of the present application is described as follows:

An embodiment of the present application provides a display panel, including:

a driving backplane; and a plurality of display components arranged in an array and on the driving backplane, wherein each of the display components includes a plurality of first bonding terminals disposed on a side facing the driving backplane, and each of the display components is electrically connected to the driving backplane through the plurality of first bonding terminals;

wherein each of the display components further includes a plurality of signal lines that are disposed on a side of the plurality of first bonding terminals away from the driving backplane, each of the signal lines is, respectively, electrically connected to a corresponding first bonding terminal, and the driving backplane is configured to provide signals to corresponding signal lines through the first bonding terminals.

In the display panel provided by the embodiments of the present application, each of the display components further includes a base substrate and a driving circuit layer disposed on a side of the base substrate away from the driving backplane, the base substrate includes the plurality of first bonding terminals, and the driving circuit layer includes the plurality of signal lines.

In the display panel provided by the embodiments of the present application, the base substrate further includes a first barrier layer and a first substrate stacked on the first bonding terminals, wherein the first substrate faces the driving circuit layer, the first barrier layer covers the first bonding terminal, and a lower surface of the first bonding terminal is exposed.

In the display panel provided by the embodiments of the present application, the base substrate further includes a second substrate disposed on a side of the first barrier layer away from the first substrate, and the second substrate is provided with an opening in an area corresponding to the first bonding terminals.

In the display panel provided by the embodiments of the present application, the driving circuit layer includes:

a semiconductor layer disposed on the base substrate;

a gate insulating layer covering the semiconductor layer and the base substrate;

a gate layer disposed on the gate insulating layer and including gates and gate scan lines;

an interlayer insulating layer covering the gate layer and the gate insulating layer;

a source-drain layer disposed on the interlayer insulating layer and including sources, drains and data lines;

wherein the plurality of signal lines includes the gate scan lines and the data lines, and the gate scan lines and the data lines are electrically connected to corresponding first bonding terminals.

In the display panel provided by the embodiments of the present application, the interlayer insulating layer is patterned to provide with first via holes, the first via holes penetrate to the first bonding terminals to expose part of upper surfaces of the first bonding terminals, and the data lines are electrically connected to the first bonding terminals through the first via holes.

In the display panel provided by the embodiments of the present application, the interlayer insulating layer is patterned to provide with second via holes and third via holes, the second via holes penetrate to the first bonding terminals to expose part of upper surfaces of the first bonding terminals, the third via holes penetrate to the gate scan lines to expose part of the gate scan lines, the source-drain layer further includes signal transition lines, and the signal transition lines are electrically connected to the first bonding terminals and the gate scan lines through the second via holes and the third via holes respectively.

In the display panel provided by the embodiments of the present application, the gate insulating layer is patterned to provide with fourth via holes, the fourth via holes penetrate to the first bonding terminals to expose part of upper surfaces of the first bonding terminals, and the gate scan lines are electrically connected to the first bonding terminals through the fourth via holes.

In the display panel provided by the embodiments of the present application, the driving backplane is provided with a second bonding terminals corresponding to the first bonding terminals of each of the display components, and the second bonding terminals are electrically connected to the first bonding terminals.

The embodiment of the present application further provides a display device including a shell and the display panel according to one of the foregoing embodiments. The shell is provided with an accommodating cavity, and the display panel is disposed in the accommodating cavity.

In the display panel and the display device provided by the embodiments of the present application, the plurality of display components is arranged in the array and on the driving backplane. Each of the display components includes the plurality of first bonding terminals disposed on the side facing the driving backplane. Each of the display components is electrically connected to the driving backplane through the plurality of first bonding terminals. By providing the first bonding terminals on one side of the display components to electrically connect to the driving backplane, the driving backplane is configured to provide signals to the corresponding signal lines located on the display components through the first bonding terminals. Therefore, it is unnecessary to provide lines, such as driving circuits etc., in the frames of the display components, so as to reduce or eliminate the frames of the display components. Thus, the display panel formed by splicing the display components together will be basically seamless, and the technical problem that relatively larger splicing gaps exist at the splicing sites of the current super-large display screen can be solved.

BRIEF DESCRIPTION OF DRAWINGS

In order to more clearly illustrate the embodiments of the present invention and the prior art, the following figures necessary for use in the embodiments and the prior art will be briefly introduced. It is obvious that the drawings are only some embodiments of the present invention, those of ordinary skill in this field can obtain other figures according to these figures without paying the premise.

DETAILED DESCRIPTION OF PREFERRED EMBODIMENTS

Figure 1:
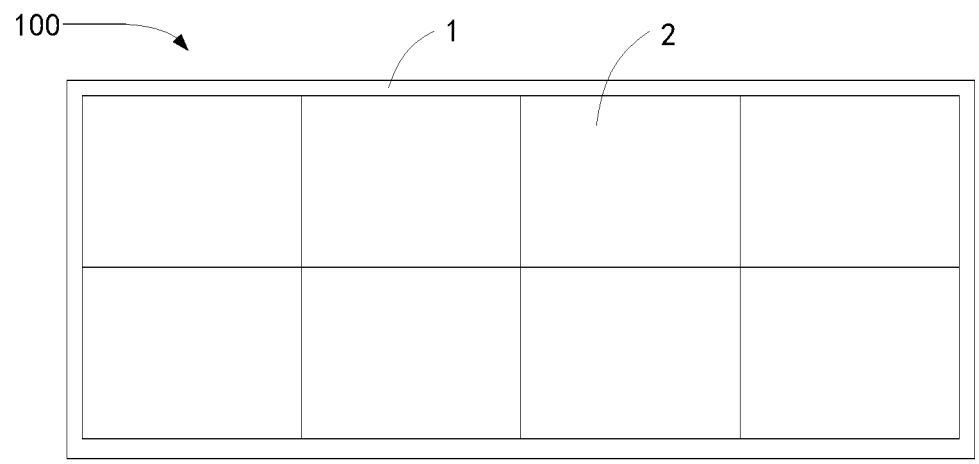
FIG. 1 is a top-view structural diagram of a display panel provided by an embodiment of the present application.

The following descriptions for the respective embodiments are specific embodiments capable of being implemented for illustrations of the present application, with references to the appended figures. The terms of "up", "down", "front", "rear", "left", "right", "interior", "exterior", "side", etcetera mentioned in the present application are merely directions referring to the appended figures. Thus, the directional terms used herein are used for describing and understanding the present application, but the present invention is not limited thereto. In the figures, units with similar structure are denoted by the same reference numerals. In the figures, for clear understanding and convenient describing, the thickness of some layers and regions are exaggerated. That is, the size and thickness of each component shown in the figures are arbitrarily shown, and the present application is not limited thereto.

In view of the problem that relatively larger splicing gaps exist at the splicing sites of the current super-large display screen, the inventor of the present application found, by studying, that the splicing gaps are mainly derived from the frames of the sub-display screens used for forming the super-large display screens by splicing. The frames of these sub-display screens are usually employed to place various bonding wires and driving circuits (such as source-driving chips) connected to the bonding wires etc., where the driving circuits provide driving signals to the sub-display screens. As the frame area cannot be displayed, after the adjacent sub-display screens are spliced together, relatively larger splicing gaps will appear at the junctions. When the large-size display screen performs displaying, the splicing gaps will be displayed as black lines, which seriously affect the display quality of the super-large display screen.

Therefore, the inventor of the present application proposes a display panel and a display device to solve the above problems.

Figure 2:
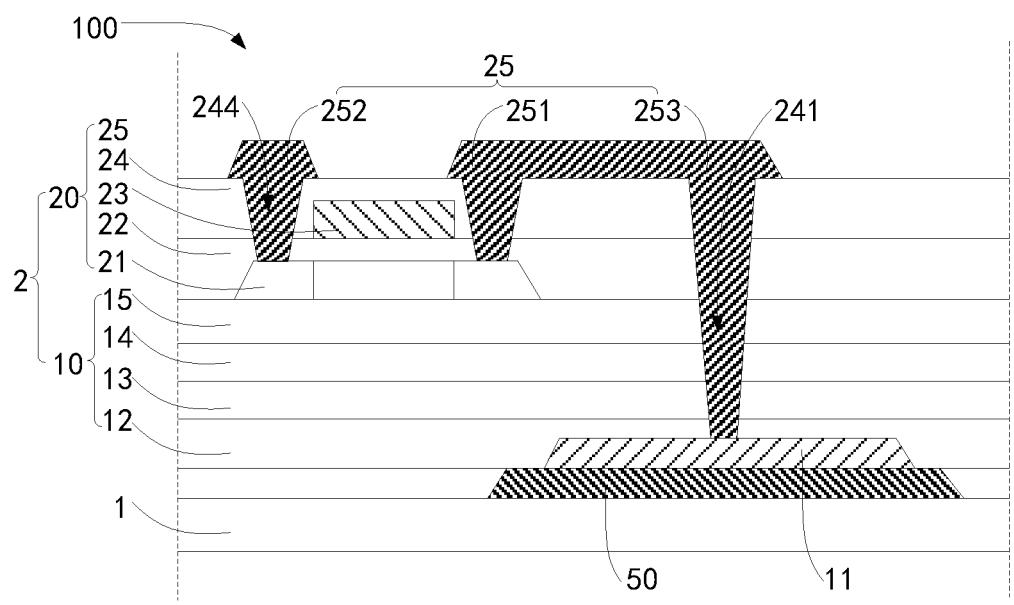
FIG. 2 is a cross-sectional diagram of partial structure of a display panel provided by an embodiment of the present application.
Figure 3:
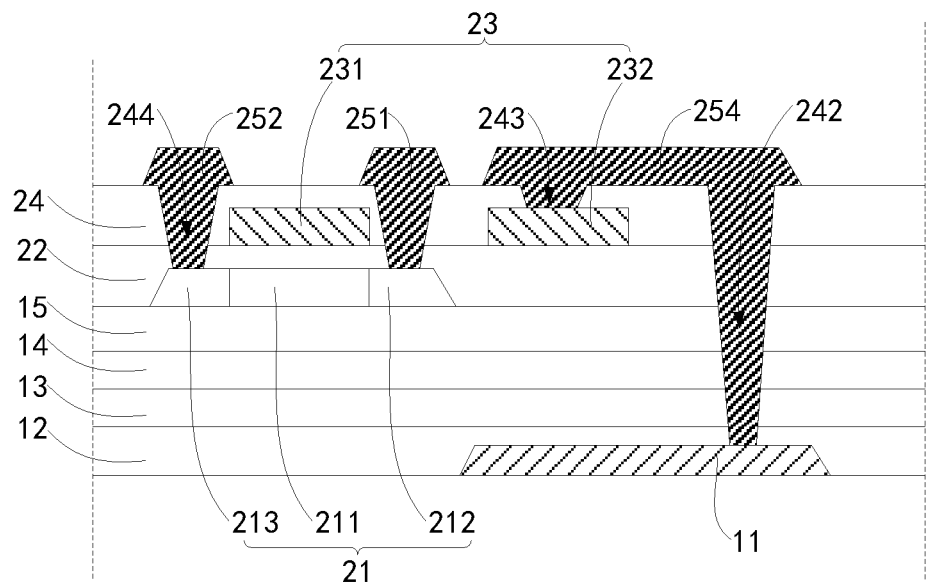
FIG. 3 is a first cross-sectional diagram of partial structure of the display components provided by an embodiment of the present application.
Figure 4:
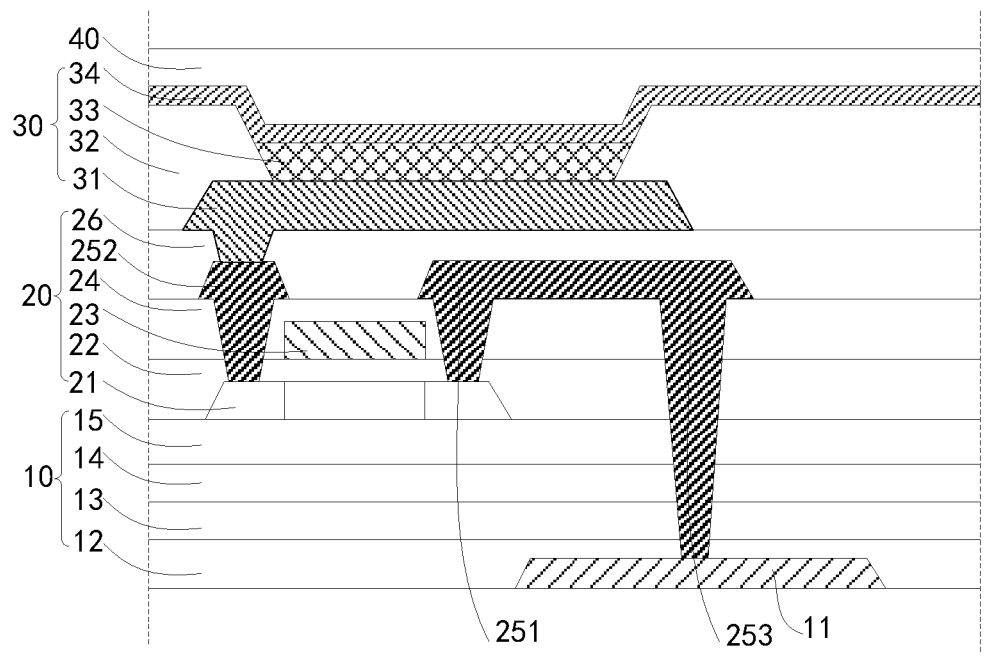
FIG. 4 is a second cross-sectional diagram of partial structure of the display components provided by an embodiment of the present application.
Figure 5:
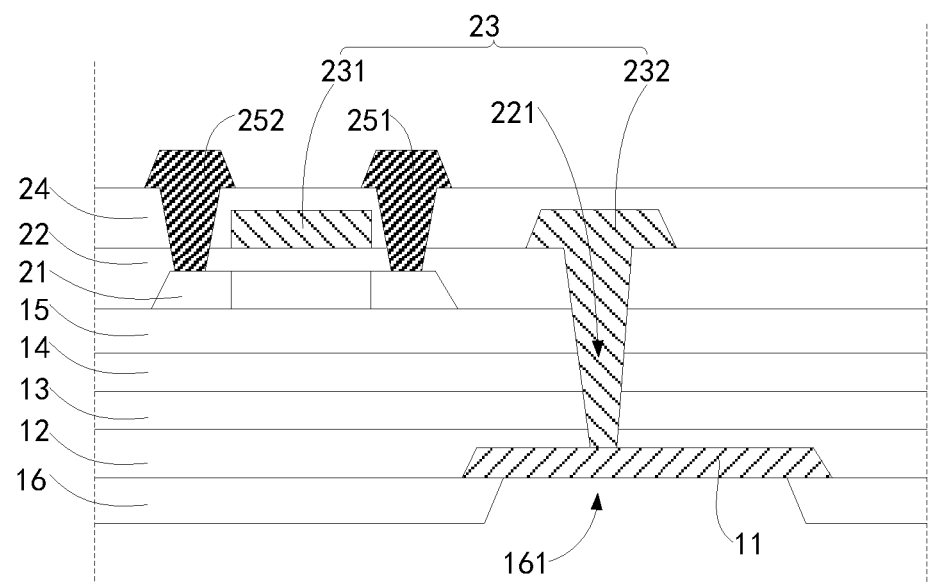
FIG. 5 is a third cross-sectional diagram of partial structure of the display components provided by an embodiment of the present application.

Please refer to FIG. 1 to FIG. 3. FIG. 1 is a top-view structural diagram of a display panel provided by an embodiment of the present application. FIG. 2 is a diagram of a partial cross-sectional structure of a display panel provided by an embodiment of the present application. FIG. 3 is a diagram of a first partial cross-sectional structure of a display component provided by an embodiment of the present application. The display panel 100 includes a driving backplane 1 and a plurality of display components 2 arranged in an array and on the driving backplane 1. Each of the display components 2 includes a plurality of first bonding terminals 11 disposed on a side facing the driving backplane 1, and each of the display components 2 is electrically connected to the driving backplane 1 through the plurality of first bonding terminals 11. Each of the display components 2 further includes a plurality of signal lines (such as the data line 253 shown in FIG. 2 and the gate scan line 232 shown in FIG. 3) disposed on a side of the plurality of first bonding terminals 11 away from the driving backplane 1, and each of the signal lines is, respectively, electrically connected to the corresponding first bonding terminal 11, so that the driving backplane 1 can provide signals to the corresponding signal line through the first bonding terminals 11.

In detail, the display component 2 further includes a base substrate 10 and a driving circuit layer 20 disposed on a side of the base substrate 10 away from the driving backplane 1, and the base substrate 10 includes the plurality of first bonding terminals 11, and the driving circuit layer 20 includes the plurality of signal lines.

The base substrate 10 further includes a first barrier layer 12 and a first substrate 13, which are stacked on the first bonding terminals 11, wherein the first substrate 13 faces the driving circuit layer 20, the first barrier layer 12 covers the first bonding terminals 11, and a lower surface of the first bonding terminal 11 is exposed. The lower surface of the first bonding terminal 11 refers to the side of the first bonding terminal 11 away from the first barrier layer 12, and the lower surface is exposed to be electrically connected to the driving backplane 1. The first bonding terminals 11 can be made of metal or alloy with strong oxidation resistance and low resistivity, such as MO, Al alloy, etc., so as to ensure the stability of the first bonding terminals 11 and the reliability of the connection with the driving backplane 1.

Optionally, the base substrate 10 further includes a second barrier layer 14 disposed on a side of the first substrate 13 away from the first barrier layer 12 and a buffer layer 15 disposed on a side of the second barrier layer 14 away from the first substrate 13. Wherein, the first barrier layer 12, the second barrier layer 14 and the buffer layer 15 can be all formed with inorganic materials, such as silicon oxide (SiOx), silicon nitride (SiNx) or silicon oxynitride (SiON), to prevent unwanted impurities or contaminants (such as moisture, oxygen, etc.) diffusing from the first substrate 13 into devices that may be damaged by these impurities or contaminants. Certainly, the base substrate 10 of the present application is not limited thereto, and the base substrate 10 of the present application may include more or less inorganic film layers. The material of the first substrate 13 includes a flexible film material, such as polyimide (PI). Meanwhile, the buffer layer 15 can also provide a flat top surface to facilitate the preparation of the driving circuit layer 20 on the base substrate 10.

Optionally, the driving circuit layer 20 includes a semiconductor layer 21, a gate insulating layer 22, a gate layer 23, an interlayer insulating layer 24 and a source-drain layer 25, and the semiconductor layer 21 is disposed on the base substrate 10. More detail, the semiconductor layer 21 is disposed on the buffer layer 15. The semiconductor layer 21 includes a channel area 211, and a source area 212 and a drain area 213, which are on the two opposite sides of the channel area 211. The gate insulating layer 22 covers the semiconductor layer 21 and the base substrate 10. The gate layer 23 is disposed on the gate insulating layer 22 and is patterned to form a gate 231 and other signal lines such as a gate scan line 232. The gate 231 is arranged corresponding to the channel area 211 of the semiconductor layer 21, and the gate scan line 232 is electrically connected to the corresponding first bonding terminal 11. The interlayer insulating layer 24 covers the gate layer 23 and the gate insulating layer 22. The source-drain layer 25 is disposed on the interlayer insulating layer 24 and is patterned to form a source 251, a drain 252 and other signal lines such as a data line 253. The source 251 and the drain 252 are electrically connected to the corresponding source area 212 and the drain area 213 of the semiconductor layer 21, respectively. The data line 253 is electrically connected to the corresponding first bonding terminal 11. The plurality of signal lines of the driving circuit layer 20 include the gate scan line 232 and the data line 253. Different signal lines are electrically connected to different ones of the first bonding terminals 11.

In detail, the interlayer insulating layer 24 is patterned to form a first via hole 241, and the first via hole 241 penetrates through the interlayer insulating layer 24, the gate insulating layer 22, the buffer layer 15, the second barrier layer 14, the first substrate 13 and the first barrier layer 12, until reaching the first bonding terminal 11 to expose part of an upper surface of the first bonding terminal 11. The upper surface of the first bonding terminal 11 refers to a surface parallel with and opposite to the lower surface of the first bonding terminal 11. The data line 253 is electrically connected to the first bonding terminal 11 through the first via hole 241. Meanwhile, the data line 253 is also electrically connected to the source 251 or the drain 252. In the present application, the electrical connection between the data line 253 and the source 251 is exemplified for illustration.

Furthermore, the interlayer insulating layer 24 is patterned to form a second via hole 242 and the third via hole 243. The second via hole 242 and the first via hole 241 have the same structure. The second via hole 242 also penetrates through the interlayer insulating layer 24, the gate insulating layer 22, the buffer layer 15, the second barrier layer 14, the first substrate 13 and the first barrier layer 12, until reaching the first bonding terminal 11 to expose part of an upper surface of the first bonding terminal 11. The third via hole 243 penetrates the interlayer insulating layer 24 and reach the gate scan line 232 to expose part of the gate scan line 232. The source-drain layer 25 further includes a signal transition line 254 arranged in the layer same as the data line 253. The signal transition line 254 is electrically connected to the first bonding terminal 11 and the gate scan line 232 through the second via hole 242 and the third via hole 243, respectively, so that the gate scan line 232 is electrically connected to the first bonding terminal 11.

Furthermore, the interlayer insulating layer 24 is further patterned to form a plurality of fifth via holes 244. All the plurality of fifth via holes 244 penetrate the interlayer insulating layer 24 and the gate insulating layer 22 to respectively expose the source area 212 and the drain area 213. The source 251 is electrically connected to the source area 212 through one of the fifth via holes 244. The drain 252 is electrically connected to the drain area 213 through another one of the fifth via holes 244.

It should be noted that, in the present application, to "have the features arranged in the same layer" indicates that, in the preparation process, the film layer formed of the same material is patterned to obtain at least two different features, and then these different features are arranged in the same layer. For instance, the signal transition line 254 and the data line 253 described in this embodiment are obtained by patterning the same conductive film layer. Thus, the signal transition line 254 and the data line 253 are arranged in the same layer.

Besides, the plurality of the signal lines of the driving circuit layer 20 in the present application are not limited to the data lines 253 and the gate scan line 232. The plurality of the signal lines may further include VSS, VDD power lines and other various signal lines used for display or non-display, and different signal lines are electrically connected to different ones of the first bonding terminals 11 to obtain different signals. For instance, the data line 253 is electrically connected to the corresponding first bonding terminal 11 to obtain a source driving signal and provide it to the source 251; the gate scan line 232 is electrically connected to the corresponding first bonding terminal 11 to obtain a gate scan signal and provide it to the gate 231.

Also, in order to provide a flat surface for the driving circuit layer 20, the driving circuit layer 20 further includes a planarization layer 26 covering the source-drain layer 25 and the interlayer insulating layer 24. Certainly, the structure of the driving circuit layer 20 of the present application is not limited to the one illustrated in this embodiment, and the driving circuit layer 20 of the present application may further include more or less of the film layers. Moreover, the positional relationship of the respective film layers is not limited to that shown in this embodiment. For instance, the gate layer 23 of the present application can also adopt a double gate structure, and the gate layer 23 may be located below the semiconductor layer 21 to form a bottom gate structure.

It can be understood that, please refer to FIG. 1 to FIG. 4, FIG. 4 is a diagram of a second partial cross-sectional structure of the display components provided by an embodiment of the present application. In order to accomplish the display function of the display components 2, the display components 2 further include a light-emitting function layer 30 disposed on the driving circuit layer 20. The driving circuit layer 20 is employed for providing a driving voltage to the light-emitting functional layer 30, so as to make the light-emitting functional layer 30 emit light. In order to protect the reliability of the light-emitting functional layer 30 and to prevent the light-emitting functional layer 30 from failing due to the intrusion of water and oxygen, the display components 2 further includes an encapsulation layer 40.

In detail, the light-emitting functional layer 30 includes a pixel electrode 31, a pixel definition layer 32, a light-emitting unit 33 and a cathode 34. The pixel electrode 31 is disposed on the planarization layer 26 and is electrically connected to the source 251 or the drain 252 through the via hole of the planarization layer 26. Certainly, since it is exemplified by electrically connecting the data line 253 and the source 251 as an illustration in this embodiment, it is, correspondingly, illustrated by having the pixel electrode 31 connected to the drain 252 herein. The pixel definition layer 32 is disposed on the pixel electrode 31 and on the planarization layer 26. The pixel definition layer 32 is patterned to form a pixel opening, and the pixel opening exposes part of the pixel electrode 31 to define the area the light-emitting unit 33 is arranged.

The light-emitting unit 33 is formed of the light-emitting material printed in the pixel opening of the pixel definition layer 32, and the light-emitting materials of different colors form the light-emitting units 33 of different colors. For instance, the light-emitting units 33 may include a red light-emitting unit formed of a red light-emitting material, a green light-emitting unit formed of a green light-emitting material and a blue light-emitting unit formed of a blue light-emitting material. The red light-emitting unit emits red light, the green light-emitting unit emits green light and the blue light-emitting unit emits blue light.

The cathode 34 covers the light-emitting unit 33 and the pixel definition layer 32. The light-emitting unit 33 emits light through the joint actions of the pixel electrode 31 and the cathode 34, and the light-emitting units 33 of different colors emit different colored lights, thereby accomplishing the pixel display of the display components 2.

Optionally, the pixel electrode 31 may be a transparent electrode or a reflective electrode. If the pixel electrode 31 is a transparent one, the pixel electrode 31 may be formed with materials like indium tin oxide (ITO), indium zinc oxide (IZO), ZnO or $In_2O_3$. If the pixel electrode 31 is a reflective one, the pixel electrode 31 may include a reflective layer, formed of Ag, Mg, Al, Pt, Pd, Au, Ni, Nd, Ir, Cr or a combination thereof, and a layer formed of ITO, IZO, ZnO or $In_2O_3$ layer. However, the pixel electrode 31 is not limited thereto, and the pixel electrode 31 may be formed of various materials, and may also be formed in a single-layer or multi-layer structure.

In detail, whether the pixel electrode 31 is a transparent electrode or a reflective electrode depends on the light-emitting direction of the display panel 100. When the display panel 100 adopts top light emission, the pixel electrode 31 can be a transparent electrode or a reflective electrode, and of course, if the reflective electrode is adopted, the utilization rate of the light emitted by the light-emitting unit 33 can be improved; when the display panel 100 adopts bottom light emission, the pixel electrode 31 adopts the transparent electrode to improve the transmittance of light. In this embodiment, the display panel 100 adopts top light emission as an illustration. Therefore, in order to improve the transmittance of light, the cathode 34 needs to be formed of a transparent conductive material. For instance, the cathode 34 may be formed of a transparent conductive oxide (TCO), such as ITO, IZO, ZnO or $In_2O_3$.

Optionally, the light-emitting functional layer 30 may further include a hole injection layer (HIL) and a hole transport layer (HTL), which are disposed between the light-emitting unit 33 and the pixel electrode 31; and an electron injection layer (EIL) and an electron transport layer (ETL), which are disposed between the light-emitting unit 33 and the cathode 34. The hole injection layer receives the holes transmitted from the pixel electrode 31, and the holes are transmitted to the light-emitting unit 33 via the hole transport layer; the electron injection layer receives the electrons transmitted from the cathode 34, and the electrons are transmitted to the light-emitting unit 33 via the electron transport layer. The holes and the electrons are combined together at the light-emitting unit 33 to generate excitons, and the excitons release energy and emit light when transiting from the excited state to the ground state.

The encapsulation layer 40 covers the light-emitting functional layer 30 and is employed to protect the light-emitting unit 33 of the light-emitting functional layer 30 to prevent the light-emitting unit 33 from failing due to the intrusions of water and oxygen. Optionally, the encapsulation layer 40 can be encapsulated by a thin film. For instance, the encapsulation layer 40 may be a laminated structure formed by successively stacking three thin films of a first inorganic encapsulation layer, an organic encapsulation layer and a second inorganic encapsulation layer, or it may be a laminated structure being stacked with multiple thin-film layers.

In this embodiment, the display panel 100 includes a driving backplane 1 and a plurality of display components 2 arranged in an array and on the driving backplane 1. Namely, the plurality of display components 2 are spliced with one another and bonded onto the driving backplane 1. The plurality of signal lines of each of the display components 2 are electrically connected to the driving backplane 1 through different one of the first bonding terminals 11, respectively. In detail, the driving backplane 1 is provided with second bonding terminals 50 corresponding to the first bonding terminals 11 of each of the display components 2. The second bonding terminals 50 are electrically connected to the first bonding terminals 11, so that the display components 2 are electrically connected to the driving backplane 1. Meanwhile, the driving backplane 1 is further provided with driving chips (not shown in the figures), etc. The second bonding terminals 50 are also electrically connected to the driving chips, so as to transmit the driving signals of the driving chips to the corresponding display components 2.

Accordingly, by arranging peripheral circuits such as driving chips on the driving backplane 1, and arranging deep holes and first bonding terminals 11 on each of the display components 2, each of the signal lines in the display components 2 can be electrically connected to the corresponding first bonding terminal 11 through the deep hole, and is connected to the driving chip through the corresponding second bonding terminal 50 to achieve the transmission of signals. Thus, for each of the display components 2, there will be no need to reserve a frame area for setting the driving chip and various bonding lines. Therefore, when the plurality of display components 2 are spliced together, there will be no relatively larger splicing gaps existing in between of the adjacent display components 2, and the problem that relatively larger splicing gaps exist at the splicing sites of the current super-large display screen will be solved.

In one embodiment, referring to FIG. 1 to FIG. 5, FIG. 5 is a diagram of a third partial cross-sectional structure of a display components provided in an embodiment of the present application, which differs from the foregoing embodiment in that, the base substrate 10 further includes a second substrate 16 disposed on the side of the first barrier layer 12 away from the first substrate 13, and the material the second substrate 16 is made of can be identical to the material the first substrate 13 is made of. The second substrate 16 is provided with an opening 161 in an area corresponding to the first bonding terminals 11, and the opening 161 is employed to expose the first bonding terminal 11 so that the display components 2 and the driving backplane 1 can achieve good electrical contact.

Also, the gate scan line 232 is directly electrically connected to the corresponding first bonding terminal 11, so that there is no need to arrange the signal transition line 254 on the source-drain layer 25. In detail, the gate insulating layer 22 is patterned to form a fourth via hole 221, and the fourth via hole 221 penetrates through the gate insulating layer 22, the buffer layer 15, the second barrier layer 14, the first substrate 13 and the first barrier layer 12, until reaching the first bonding terminal 11 to expose part of the upper surface of the first bonding terminal 11. The gate scan line 232 is electrically connected to the first bonding terminal 11 through the fourth via hole 221. For other descriptions, please refer to the aforesaid embodiments, which will not be repeated here.

Figure 6:
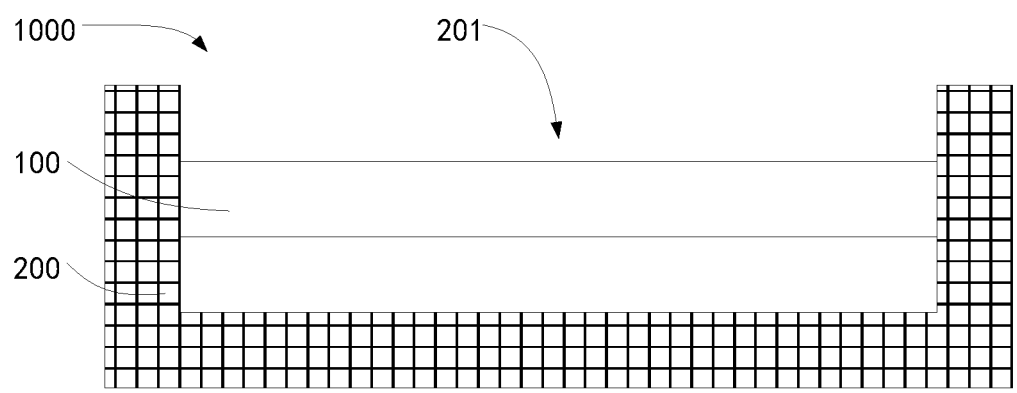
FIG. 6 is a cross-sectional diagram of structure of a display device provided by an embodiment of the present application.

In an embodiment, referring to FIG. 6, FIG. 6 is a diagram of a cross-sectional structure of a display device provided by an embodiment of the application. The display device 1000 includes a shell 200 and a display panel 100 according to any one of the foregoing embodiments. The shell 200 is formed with an accommodating cavity 201, and the display panel 100 is disposed in the accommodating cavity 201.

It can be known according to the aforesaid embodiments:

The present application provides a display panel and a display device. The display panel includes a driving backplane and a plurality of display components arranged in an array and on the driving backplane, and each of the display components includes a plurality of first bonding terminals disposed on a side facing the driving backplane and a plurality of signal lines disposed on a side of the plurality of first bonding terminals away from the driving backplane. Each of the display components is electrically connected to the driving backplane through the plurality of first bonding terminals, and each of the signal lines is electrically connected to the corresponding first bonding terminals, respectively. Thus, the driving backplane can provide signals to the corresponding signal lines through the first bonding terminals. Therefore, it is unnecessary to arrange lines, such as driving circuits, on the frames of the display components, so as to reduce or eliminate the frame of the display components. Thus, the display panel formed by splicing the display components together will be basically seamless, and the technical problem, that relatively larger splicing gaps exist at the splicing sites of the current super-large display screen, will be alleviated.

In the foregoing embodiments, the descriptions of the various embodiments have respective different emphases, and a part in some embodiment, which is not described in detail can be referred to the related descriptions of other embodiments.

The embodiments of the present application are described in detail as aforementioned, and the principles and implementations of the present application have been described with reference to specific illustrations. The description of the foregoing embodiments is merely for helping to understand the technical solutions of the present application and the core ideas thereof; those skilled in the art should understand that the technical solutions described in the foregoing embodiments may be modified, or some of the technical features may be equivalently replaced; and the modifications or replacements do not deviate from the spirit and scope of the technical solutions of the embodiments of the present application.

What is claimed is:

1. A display panel, comprising:
a driving backplane; and
a plurality of display components arranged in an array and on the driving backplane, wherein each of the display components comprises a plurality of first bonding terminals disposed on a side facing the driving backplane, and each of the display components is electrically connected to the driving backplane through the plurality of first bonding terminals;

wherein each of the display components further comprises a plurality of signal lines that are disposed on a side of the plurality of first bonding terminals away from the driving backplane, each of the signal lines is, respectively, electrically connected to a corresponding first bonding terminal, and the driving backplane is configured to provide signals to corresponding signal lines through the first bonding terminals;

wherein each of the display components further comprises a base substrate and a driving circuit layer disposed on a side of the base substrate away from the driving backplane, the base substrate comprises the plurality of first bonding terminals, and the driving circuit layer comprises the plurality of signal lines; and wherein the plurality of signal lines comprises gate scan lines and data lines, and the gate scan lines and the data lines are electrically connected to corresponding first bonding terminals.

2. The display panel according to claim 1, wherein the base substrate further comprises a first barrier layer and a first substrate stacked on the first bonding terminals, wherein the first substrate faces the driving circuit layer, the first barrier layer covers the first bonding terminal, and a lower surface of the first bonding terminal is exposed.

3. The display panel according to claim 2, wherein the base substrate further comprises a second substrate disposed on a side of the first barrier layer away from the first substrate, and the second substrate is provided with an opening in an area corresponding to the first bonding terminals.

4. The display panel according to claim 3, wherein the driving circuit layer comprises:
a semiconductor layer disposed on the base substrate;
a gate insulating layer covering the semiconductor layer and the base substrate;
a gate layer disposed on the gate insulating layer and comprising gates and gate scan lines;
an interlayer insulating layer covering the gate layer and the gate insulating layer;
a source-drain layer disposed on the interlayer insulating layer and comprising sources, drains and data lines.

5. The display panel according to claim 4, wherein the interlayer insulating layer is patterned to provide with first via holes, the first via holes penetrate to the first bonding terminals to expose part of upper surfaces of the first bonding terminals, and the data lines are electrically connected to the first bonding terminals through the first via holes.

6. The display panel according to claim 4, wherein the interlayer insulating layer is patterned to provide with second via holes and third via holes, the second via holes penetrate to the first bonding terminals to expose part of upper surfaces of the first bonding terminals, the third via holes penetrate to the gate scan lines to expose part of the gate scan lines, the source-drain layer further comprises signal transition lines, and the signal transition lines are electrically connected to the first bonding terminals and the gate scan lines through the second via holes and the third via holes respectively.

7. The display panel according to claim 4, wherein the gate insulating layer is patterned to provide with fourth via holes, the fourth via holes penetrate to the first bonding terminals to expose part of upper surfaces of the first bonding terminals, and the gate scan lines are electrically connected to the first bonding terminals through the fourth via holes.

8. The display panel according to claim 3, wherein a material of the second substrate is same as a material of the first substrate.

9. The display panel according to claim 1, wherein the driving backplane is provided with second bonding terminals corresponding to the first bonding terminals of each of the display components, and the second bonding terminals are electrically connected to the first bonding terminals.

10. A display device, comprising:
a shell provided with an accommodating cavity;
a display panel disposed in the accommodating cavity, wherein the display panel comprises:
a driving backplane; and
a plurality of display components arranged in an array and on the driving backplane, wherein each of the display components comprises a plurality of first bonding terminals disposed on a side facing the driving backplane, and each of the display components is electrically connected to the driving backplane through the plurality of first bonding terminals;
wherein each of the display components further comprises a plurality of signal lines that are disposed on a side of the plurality of first bonding terminals away from the driving backplane, each of the signal lines is, respectively, electrically connected to a corresponding first bonding terminal, and the driving backplane is configured to provide signals to corresponding signal lines through the first bonding terminals;
wherein each of the display components further comprises a base substrate and a driving circuit layer disposed on a side of the base substrate away from the driving backplane, the base substrate comprises the plurality of first bonding terminals, and the driving circuit layer comprises the plurality of signal lines; and
wherein the plurality of signal lines comprises gate scan lines and data lines, and the gate scan lines and the data lines are electrically connected to corresponding first bonding terminals.

11. The display device according to claim 10, wherein the base substrate further comprises a first barrier layer and a first substrate stacked on the first bonding terminals, wherein the first substrate faces the driving circuit layer, the first barrier layer covers the first bonding terminals, and the lower surfaces of the first bonding terminals are exposed.

12. The display device according to claim 11, wherein the base substrate further comprises a second substrate disposed on a side of the first barrier layer away from the first substrate, and the second substrate is provided with an opening in an area corresponding to the first bonding terminals.

13. The display device according to claim 12, wherein the driving circuit layer comprises:
a semiconductor layer disposed on the base substrate;
a gate insulating layer covering the semiconductor layer and the base substrate;
a gate layer disposed on the gate insulating layer and comprising gates and gate scan lines;
an interlayer insulating layer covering the gate layer and the gate insulating layer;
a source-drain layer disposed on the interlayer insulating layer and comprising sources, drains and data lines.

14. The display device according to claim 13, wherein the interlayer insulating layer is patterned to provide with first via holes, the first via holes penetrate to the first bonding terminals to expose part of upper surfaces of the first bonding terminals, and the data lines are electrically connected to the first bonding terminals through the first via holes.

15. The display device according to claim 13, wherein the interlayer insulating layer is patterned to provide with second via holes and third via holes, the second via holes penetrate to the first bonding terminals to expose part of upper surfaces of the first bonding terminals, the third via holes penetrate to the gate scan lines to expose part of the gate scan lines, the source-drain layer further comprises signal transition lines, and the signal transition lines are electrically connected to the first bonding terminals and the gate scan lines through the second via holes and the third via holes respectively.

16. The display device according to claim 13, wherein the gate insulating layer is patterned to provide with fourth via holes, the fourth via holes penetrate to the first bonding terminals to expose part of upper surfaces of the first bonding terminals, and the gate scan lines are electrically connected to the first bonding terminals through the fourth via holes.

17. The display device according to claim 12, wherein a material of the second substrate is same as a material of the first substrate.

18. The display device according to claim 10, wherein the driving backplane is provided with second bonding terminals corresponding to the first bonding terminals of each of the display components, and the second bonding terminals are electrically connected to the first bonding terminals.

19. A display panel, comprising:
a driving backplane; and
a plurality of display components arranged in an array and on the driving backplane, wherein each of the display components comprises a plurality of first bonding terminals disposed on a side facing the driving backplane, and each of the display components is electrically connected to the driving backplane through the plurality of first bonding terminals;
wherein each of the display components further comprises a plurality of signal lines that are disposed on a side of the plurality of first bonding terminals away from the driving backplane, each of the signal lines is, respectively, electrically connected to a corresponding first bonding terminal, and the driving backplane is configured to provide signals to corresponding signal lines through the first bonding terminals;
wherein each of the display components further comprises a base substrate and a driving circuit layer disposed on a side of the base substrate away from the driving backplane, the base substrate comprises the plurality of first bonding terminals, and the driving circuit layer comprises the plurality of signal lines;
wherein the base substrate further comprises a first barrier layer and a first substrate stacked on the first bonding terminals, wherein the first substrate faces the driving circuit layer, the first barrier layer covers the first bonding terminal, and a lower surface of the first bonding terminal is exposed; and
wherein the base substrate further comprises a second substrate disposed on a side of the first barrier layer away from the first substrate, and the second substrate is provided with an opening in an area corresponding to the first bonding terminals.

20. The display panel according to claim 19, wherein the driving circuit layer comprises:
a semiconductor layer disposed on the base substrate;

a gate insulating layer covering the semiconductor layer and the base substrate;
a gate layer disposed on the gate insulating layer and comprising gates and gate scan lines;
an interlayer insulating layer covering the gate layer and the gate insulating layer;
a source-drain layer disposed on the interlayer insulating layer and comprising sources, drains and data lines;
wherein the plurality of signal lines comprises the gate scan lines and the data lines, and the gate scan lines and the data lines are electrically connected to corresponding first bonding terminals.

* * * * *